United States Patent [19]
Sobhani

[11] Patent Number: 5,455,518
[45] Date of Patent: Oct. 3, 1995

[54] TEST APPARATUS FOR INTEGRATED CIRCUIT DIE

[75] Inventor: Mohi Sobhani, Encino, Calif.

[73] Assignee: Hughes Aircraft Company, Los Angeles, Calif.

[21] Appl. No.: 157,556

[22] Filed: Nov. 26, 1993

[51] Int. Cl.$^6$ ........................................ G01R 31/02
[52] U.S. Cl. ............................. 324/765; 324/762
[58] Field of Search ........................... 324/73.1, 158.1, 324/760, 765, 755, 762; 437/8; 174/52.4; 361/717, 718, 719, 720, 722

[56] References Cited

U.S. PATENT DOCUMENTS

| | | | |
|---|---|---|---|
| 4,783,719 | 11/1988 | Jamison et al. | 324/537 |
| 4,956,605 | 9/1990 | Bickford et al. | 324/760 |
| 5,156,983 | 10/1992 | Schleringer et al. | 324/158.1 |

*Primary Examiner*—Vinh P. Nguyen
*Attorney, Agent, or Firm*—Mary E. Lachman; Michael W. Sales; Wanda K. Denson-Low

[57] ABSTRACT

An integrated circuit testing system for testing small quantities of integrated circuit die. The testing system includes an integrated circuit tester and a base printed wiring board interface that physically and electrically interfaces thereto. A die holder that holds an integrated circuit die is coupled to the base printed wiring board interface. A flexprint structure including first and second flexible contact structures is provided that electrically connect to the base printed wiring board interface, to pads on the integrated circuit die, and to each other to provide for electrical connection between the tester and the die. A plurality of alignment pins are provided for aligning the first and second flexible contact structures to each other and to the pads on the integrated circuit die. The present system is specifically designed for testing low quantities of small and large die, such as application specific integrated circuits (ASIC), without attaching the die to a substrate and wire bonding it for test purposes. The testing system is versatile in that it can test a variety of pad patterns on the die. The system is relatively low cost and has a low cost per operation. Furthermore, the system provides for high test accuracy and good quality contact to the die.

4 Claims, 4 Drawing Sheets

TEST APPARATUS FOR INTEGRATED CIRCUIT DIE

BACKGROUND

The present invention relates generally to integrated circuit testing apparatus, and more particularly, to integrated circuit testing apparatus that provides for testing of small numbers of integrated circuit die in a cost-effective manner.

Conventional techniques relating to integrated circuit testers include the use of apparatus known as a microprobe, various methods involving die bonding or wire bonding the die to test it and then removing the die with or without the attached wires, utilizing various tab automated bonding (TAB) systems to wire bond the die to test it, and utilizing gate array packages into which a die is wired for testing and then removing the die from the gate array package prior to the next assembly.

In many of these conventional techniques, an inordinate amount of time is spent in physically attaching wires to the die in order to test it. In many instances, the handling required to wire the die for testing damages some of the integrated circuits. This makes some of the integrated circuits unusable. In the case of specialized integrated circuits that are fabricated in small quantities, such as for specialized military programs or for prototype circuits, the high cost to manufacture such small quantifies of circuits makes it imperative that damage due to testing be minimized or eliminated. However, the conventional practices have not achieved this.

Accordingly, it is an objective of the present invention to provide for integrated circuit testing apparatus that permits testing of small numbers of integrated circuit die. It is a further objective of the present invention to provide for integrated circuit testing apparatus that does not require wiring of the die.

SUMMARY OF THE INVENTION

In order to meet the above and other objectives, the present invention is an integrated circuit testing system for testing small quantities of integrated circuit die. The integrated circuit testing system comprises an integrated circuit tester and a base printed wiring board interface that interfaces to the tester. An integrated circuit die holder that holds an integrated circuit die is coupled to the base printed wiring board interface. A flexprint structure comprising first and second flexible contact structures is provided that electrically connect to the base printed wiring board interface, to pads on the integrated circuit die, and to each other to provide for electrical connection between the integrated circuit tester and the integrated circuit die. A plurality of alignment pins are provided for aligning the first and second flexible contact structures to each other and to the pads on the integrated circuit die.

The present invention comprises testing apparatus specifically designed for testing low quantities of small and large die, such as application specific integrated circuits (ASIC) without attaching the die to a substrate and wire bonding it for test purposes. Typical wafers include gallium arsenide, germanium and silicon wafers. The present testing apparatus is capable of testing the die at full temperature.

The present testing apparatus is versatile in that it can test a variety of pad patterns on the die. The present invention is relatively low cost and has a low cost per operation. Furthermore, the present invention provides for high test accuracy and good quality contact to the die. The present invention is adapted to test integrated circuit die without packaging or disturbing the die prior to final assembly, such as in a hybrid or multichip module package, for example.

The present invention is versatile in that it is adapted to test any size die having any pad pattern. It is inexpensive compared with other devices performing the same task. The present invention minimizes the cost of testing bare chips for various assemblies. The present invention is adapted to test advanced integrated circuit devices having high density interconnections. Hybrid manufacturing facilities may utilize the present invention for testing the die prior to die attachment to hybrid assemblies.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
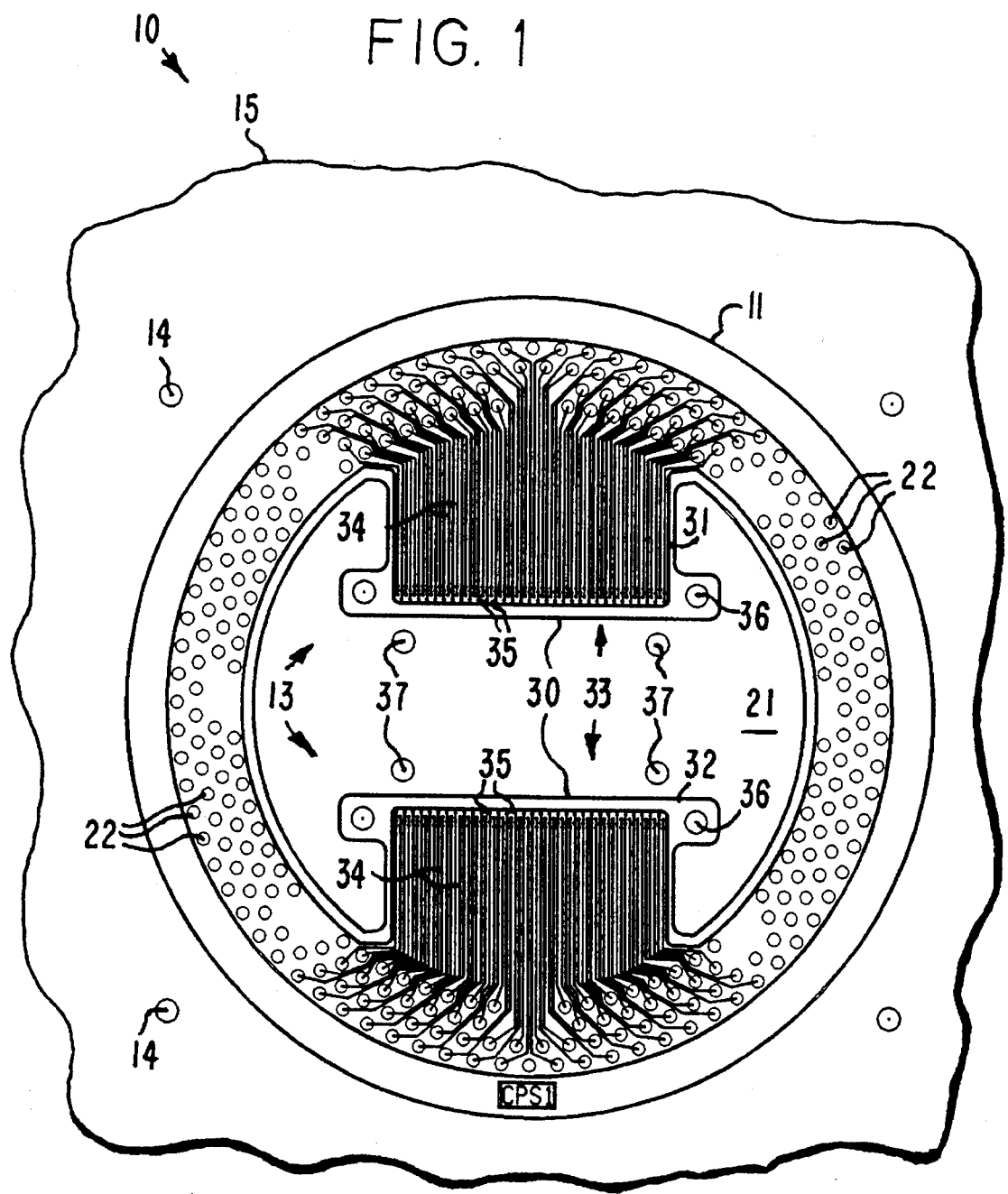
FIG. 1 is a top view of a circuit board and a first contact structure of integrated circuit testing apparatus in accordance with the principles of the present invention.

Referring to the drawing figures, integrated circuit testing apparatus 10 in accordance with the present invention is comprised of four primary elements as are shown in FIGS. 1–5. The integrated circuit testing apparatus 10 is comprised of a base printed wiring board interface 11, an integrated circuit (die) holder 12, a flexprint 13, and a set of alignment pins 14. The integrated circuit testing apparatus 10 is used to test a die 16 or integrated circuit 16 without wire bonding it prior to testing. Typical die 16 or integrated circuits 16 include gallium arsenide, germanium and silicon wafers.

More particularly, and referring to FIG. 1, it illustrates a top view of the integrated circuit testing apparatus 10 showing the base printed wiring board interface 11 and a first contact structure 30 that forms part of the flexprint 13. The flexprint 13 is comprised of a single-sided polyimide-based material having bumps or dimples formed disposed thereon as will be described below. The base printed wiring board interface 11 may be comprised of a readily available round shaped printed wiring board 21 that is adapted to interface with an automatic or semiautomatic tester 15 a portion of which is shown in FIG. 1, and which corresponds to an X-Y-θ table. The base printed wiring board interface 11 is specifically made to interface to the particular tester 15 with which the apparatus 10 of the present invention is to be employed. The base printed wiring board 21 is comprised of a plurality of electrical contact pads 22 that connect to the tester 15 in a conventional manner. Selected ones of the electrical contact pads 22 are coupled to the first contact structure 30.

The first contact structure 30 is comprised of two flexible members 31, 32 that each comprise a flexible material such as mylar, for example, that forms a flexible substrate 33. A plurality of electrical leads 34 are formed on the flexible substrate 33. The plurality of electrical leads 34 terminate at a plurality of raised bumps 35, for example, which are located on one end of the first flexible substrate 33. The two flexible members 31, 32 of the first contact structure 30 are separated from each other by a predetermined distance and are affixed and aligned to the printed wiring board 21 by means of a first plurality of dowel pins 36 that are secured thereto. A second plurality of dowel pins 37 are disposed on the printed wiring board 21 that are used to secure and align the integrated circuit die holder 12 and a second contact structure 40 thereto.

Figure 2:
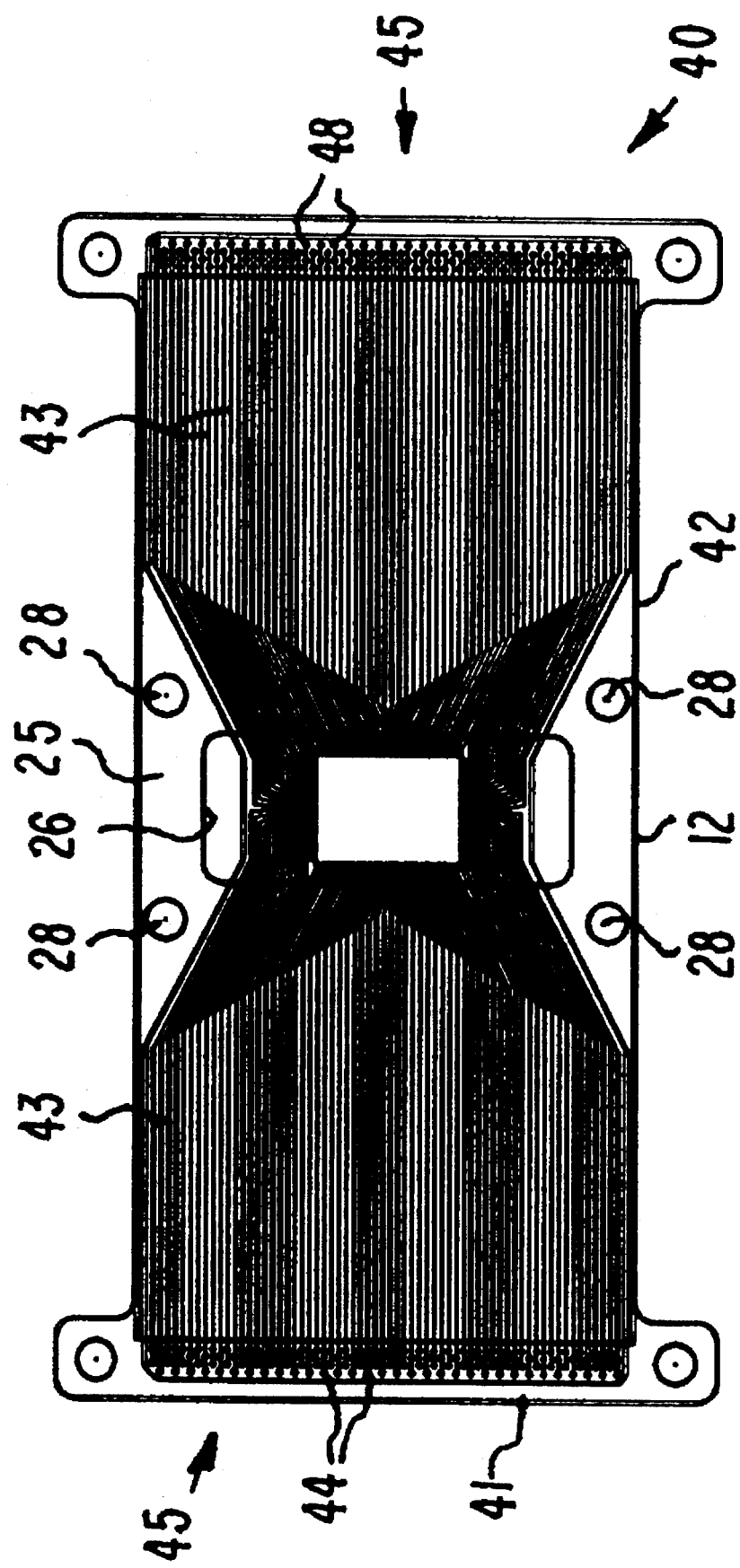
FIG. 2 is a top view of a second contact structure employed with the integrated circuit testing apparatus of FIG. 1

Referring to FIG. 2, the integrated circuit (die) holder 12 is comprised of an aluminum plate 25 with a cavity 26 disposed therein that is the same size of die 16. The plate 25 has a hole 27 disposed therein for a vacuum hose attachment and four additional holes 28 that provide for precision alignment between the bumps 35 on the flexprint 13 and input and output (I/O) pads (not shown) on the die 16.

The second contact structure 40 that forms part of the flexprint 13 is shown in FIG. 2. The second contact structure 40 is comprised of a single flexible member 41 that comprises a flexible material such as mylar, for example, and that forms a second flexible substrate 42. A plurality of electrical leads 43 are formed on the flexible substrate 42. The plurality of electrical leads 43 terminate at a plurality of raised bumps 44 or dimples 45, for example, which are located on both ends of the second flexible substrate 42.

Figure 3:
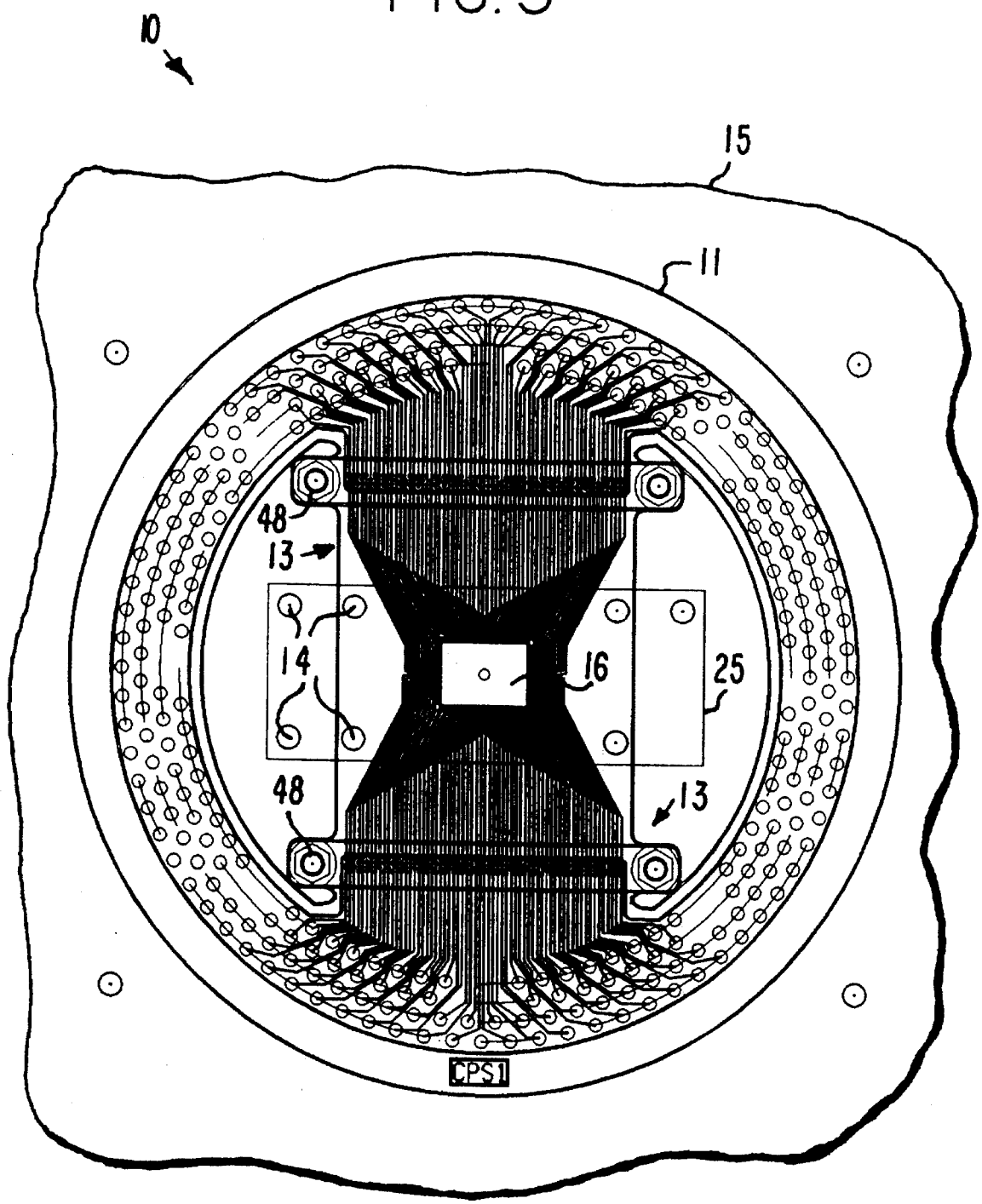
FIG. 3 is a top view of a fully assembled integrated circuit testing apparatus in accordance with the principles of the present invention.

A fully assembled integrated circuit testing apparatus 10 is shown in FIG. 3. As can be seen in FIG. 3, the integrated circuit die holder 12 is secured to the printed wiring board 21 by means of the plurality of dowel pins 48. The integrated circuit die 16 is disposed in the integrated circuit die holder 12. The second contact structure 40 overlays the integrated circuit die holder 12 and integrated circuit die 16 and is secured thereto by means of the plurality of dowel pins 48. The bumps on the second contact structure 40 are pressed against the contact pads of the integrated circuit die 16. The second contact structure 40 also mates with the first contact structure 30 at the location of their respective pluralities of bumps 35, 44 which couple electrical signals from the printed wiring board 21 to the first contact structure 30, to the second contact structure 40, and finally to the integrated circuit die 16.

The alignment of the first and second contact structures 30, 40 and integrated circuit die 16 is provided by means of four precision dowel pins 48, or drill blanks 48, that are disposed through the flexprint 13. The dowel pins 34 align the bumps 35 on the second contact structure 40 to the pads on the die 16, and align the bumps 35, 44 on the first and second contact structures 30, 40 to each other so that electrical contact is made therebetween, as is illustrated in FIG. 3.

Figure 4:
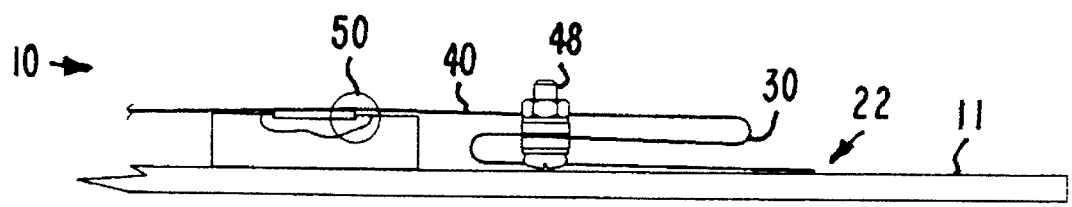
FIG. 4 is a partially cutaway side view of the integrated circuit testing apparatus of FIG. 3.
Figure 5:
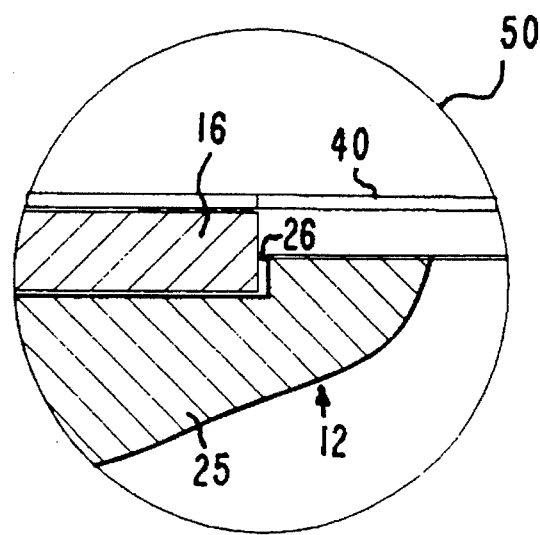
FIG. 5 is an enlarged view of an encircled portion of FIG. 4.

FIG. 4 shows a partially cutaway side view of the integrated circuit testing apparatus 10 of FIG. 3. The flexible nature of the first and second contact structures 30, 40 is more clearly shown as well as the mating of the bumps 35, 44 on the first and second contact structures 30, 40 to each other. An encircled portion 50 of the integrated circuit testing apparatus 10 is detailed in FIG. 5, which illustrates an enlarged view of the encircled portion 50 shown in FIG. 4. FIG. 5 shows the relationship between the integrated circuit die 16 and the cavity 26 in the aluminum plate 25 that forms the integrated circuit die holder 12. The relative location of the second contact structure 40 to the top surface of the die is also shown.

Thus there has been described a new and improved integrated circuit testing apparatus that provides for testing of small numbers of integrated circuit die in a cost-effective manner. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An integrated circuit testing system for testing small quantities of bare integrated circuit die, said system comprising:

an integrated circuit tester;

a base printed wiring board interface for physically and electrically interfacing to the tester;

an integrated circuit die holder coupled to the base printed wiring board interface that holds an integrated circuit die wherein said integrated circuit die is free from wire bonds;

a flexprint structure comprising first and second flexible contact structures each comprising a plurality of electrical leads that terminate in a plurality of bumps or dimples for electrically interconnecting the base printed wiring board interface, pads on the integrated circuit die, and first and second flexible contact structures to provide for electrical connection between the integrated circuit tester and the integrated circuit die when said contact structures are pressed together, wherein said first contact structure comprises first and second flexible members that are separated by a predetermined distance; and a plurality of alignment pins for aligning the first and second flexible contact structures to each other and to the pads on the integrated circuit die.

2. The integrated circuit testing system of claim 1 wherein the die comprises a gallium arsenide wafer.

3. The integrated circuit testing system of claim 1 wherein the die comprises a germanium wafer.

4. The integrated circuit testing system of claim 1 wherein the die comprises a silicon wafer.

* * * * *